(12) United States Patent
Xu et al.

(10) Patent No.: US 11,106,298 B2
(45) Date of Patent: Aug. 31, 2021

(54) TOUCH DISPLAY PANELS AND TOUCH DISPLAY DEVICES

(71) Applicant: Yungu (Gu'an) Technology Co., Ltd., Hebei (CN)

(72) Inventors: Peng Xu, Jiangsu (CN); Yun Cheng, Jiangsu (CN); Bing Wang, Jiangsu (CN); Xiaoyu Jiang, Jiangsu (CN); Lipeng Gao, Jiangsu (CN)

(73) Assignee: Yungu (Gu'an) Technology Co., Ltd., Hebei (CN)

( * ) Notice: Subject to any disclaimer, the term of this patent is extended or adjusted under 35 U.S.C. 154(b) by 0 days.

(21) Appl. No.: 16/464,533

(22) PCT Filed: Jul. 18, 2018

(86) PCT No.: PCT/CN2018/096163
§ 371 (c)(1),
(2) Date: Jul. 1, 2020

(87) PCT Pub. No.: WO2019/105045
PCT Pub. Date: Jun. 6, 2019

(65) Prior Publication Data
US 2020/0348781 A1  Nov. 5, 2020

(30) Foreign Application Priority Data

Nov. 30, 2017  (CN) .......................... 201711241276.9
Nov. 30, 2017  (CN) .......................... 201711244662.3

(51) Int. Cl.
*G06F 3/041* (2006.01)
*H01L 27/32* (2006.01)
*H01L 51/52* (2006.01)

(52) U.S. Cl.
CPC .......... *G06F 3/0412* (2013.01); *H01L 27/323* (2013.01); *H01L 51/5237* (2013.01)

(58) Field of Classification Search
CPC ............... G06F 3/0412; G06F 3/04164; H01L 27/323; H01L 51/5237; H01L 51/5253; H01L 51/5246; H01L 23/52
See application file for complete search history.

(56) References Cited

U.S. PATENT DOCUMENTS

2018/0053810 A1\* 2/2018 Jin ...................... G06F 3/04164
2018/0348913 A1\* 12/2018 Lee ....................... G06F 3/0412

FOREIGN PATENT DOCUMENTS

| CN | 107180852 A | 9/2017 |
| CN | 107315498 A | 11/2017 |
| CN | 107992228 A | 5/2018 |
| CN | 108155211 A | 6/2018 |
| TW | M432092 U | 6/2012 |

(Continued)

*Primary Examiner* — Alexander Eisen
*Assistant Examiner* — Kebede T Teshome
(74) *Attorney, Agent, or Firm* — BakerHostetler

(57) ABSTRACT

The disclosure discloses a touch display panel and a touch display device. The touch display panel includes: a display panel, an encapsulation layer and a touch lead, wherein, the display panel includes a display area and a non-display area including a lead bonding area; the encapsulation layer covers the display area and extends to the lead bonding area; the touch lead extends to the lead bonding area along a side of the encapsulation layer away from the display area.

18 Claims, 3 Drawing Sheets

(56) References Cited

FOREIGN PATENT DOCUMENTS

| | | |
|---|---|---|
| TW | M450786 U | 4/2013 |
| TW | M488053 U | 10/2014 |
| TW | I557612 B | 11/2016 |

* cited by examiner

TOUCH DISPLAY PANELS AND TOUCH DISPLAY DEVICES

CROSS-REFERENCE TO RELATED APPLICATIONS

This application is a National Stage of International patent application PCT/CN2018/096163, filed on Jul. 18, 2018, which claims priority to foreign Chinese patent application Nos. CN 201711241276.9 and CN 201711244662.3, filed Nov. 30, 2017, the disclosures of which are incorporated by reference in their entireties.

TECHNICAL FIELD

Exemplary embodiments of the disclosure relate to the field of display technology, and in particular, to touch display panels and touch display devices.

BACKGROUND

A touch display panel integrates a touch screen with a flat display panel to enable the flat display panel with a touch function. Generally, the touch display panel may provide a human-computer interactive interface, and allows input through fingers, a stylus, etc., which is more direct and more humanized in use. With the development of display technology, touch display panels are increasingly used in various display devices.

A touch display panel generally includes a display drive lead and a touch lead. To facilitate control of the display drive lead and the touch lead, the touch lead may extend to a lead bonding area of the display panel and bond together with the display drive lead.

However, in practical applications, the touch lead needs to cross a non-display area of the display panel when the touch lead extends to the lead bonding area of the display panel, and the touch lead is prone to break during crossing the non-display area, leading to poor contact of the touch lead, which in turn affects the touch function of the touch display panel.

SUMMARY

The main purpose of the disclosure is to provide touch display panels and touch display devices aimed to solve the problem in the prior touch display panel that the touch lead, when it is bonded to the lead area, is prone to break during crossing the non-display area, leading to poor contact of the touch lead, which in turn affects the touch function of the touch display panel.

To achieve the above purpose, the disclosure provides a touch display panel, including: a display panel, an encapsulation layer and a touch lead, wherein:

the display panel includes a display area and a non-display area, and the non-display area includes a lead bonding area;

the encapsulation layer covers the display area, the encapsulation layer extends to the lead bonding area, and the touch lead extends to the lead bonding area along a side of the encapsulation layer away from the display area.

Optionally, the non-display area comprising a dam-type area, wherein:

the dam-type area is located between the lead bonding area and the display area, and the encapsulation layer extends to and covers the dam-type area.

Optionally, a portion of the encapsulation layer which covers the dam-type area and extends to the lead bonding area has a planarized structure.

Optionally, a height of the portion of the encapsulation layer which extends to the lead bonding area relative to the display panel remains unchanged along an extending direction of the encapsulation layer.

Optionally, the lead bonding area includes a touch lead bonding area and a display drive lead bonding area, the encapsulation layer after extending to the lead bonding area, covers the touch lead bonding area and does not cover the display drive lead bonding area.

Optionally, the display panel further includes a display drive lead, wherein:

the display drive lead and the touch lead extend to the lead bonding area in the same direction, and the display drive lead is bonded to the display drive lead bonding area at a first height, the touch lead is bonded to the touch lead bonding area at a second height, the first height is less than the second height.

Optionally, the touch lead and the display drive lead are covered with a conductive adhesive film, and the conductive adhesive film is covered with a flexible printed circuit board to achieve bonding of the touch lead and the display drive lead at different heights, and the encapsulation layer includes at least one of a thin film encapsulation layer and a substrate layer, a material of the encapsulation layer includes an organic material.

Optionally, the touch display panel further includes a first conductive layer and a second conductive layer, wherein the first conductive layer is located on one side of the encapsulation layer, and the second conductive layer is located between the encapsulation layer and the first conductive layer, wherein:

the first conductive layer includes an inductive electrode, and the second conductive layer includes a drive electrode; or the second conductive layer includes the inductive electrode, and the first conductive layer includes the drive electrode; or the first conductive layer includes the inductive electrode and the drive electrode, and the second conductive layer includes a bridge; or the second conductive layer includes the inductive electrode and the drive electrode, and the first conductive layer includes a bridge.

Optionally, the touch lead includes an inductive lead and a drive lead, the inductive lead and the inductive electrode are located in the same conductive layer, and the drive lead and the drive electrode are located in the same conductive layer;

if the touch lead is not in contact with the side of the encapsulation layer away from the display panel, the touch lead is led to the side of the encapsulation layer away from the display panel by punching.

The following technical effects can be achieved by at least one of the above technical solutions adopted by exemplary embodiments of the disclosure:

A touch display panel provided by an exemplary embodiment of the disclosure includes: a display panel, an encapsulation layer and a touch lead. The display panel includes a display area and a non-display area including a lead bonding area. And the encapsulation layer covers the display area and extends to the lead bonding area. The touch lead extends to the lead bonding area along a side of the encapsulation layer away from the display area. Since in the touch display panel provided by the exemplary embodiment of the disclosure, the encapsulation layer extends to the lead bonding area, and the touch lead may extend to the lead bonding area along the encapsulation layer, compared with the prior art, the stress acting on the touch lead can be effectively reduced, thereby preventing the touch lead from being broken, and effectively ensuring the touch function of the touch display panel.

To achieve the above purpose, the disclosure also provides a touch display panel, comprising: a display panel and a touch layer covering the display panel, wherein:

the display panel includes a non-display area including a lead bonding area;

the touch layer includes a touch lead and an insulation layer, and the insulation layer extends to the lead bonding area, and the touch lead extends to the lead bonding area along a side of the insulation layer away from the display panel.

Optionally, the display panel further includes a display area, the non-display area further includes a dam-type area, wherein:

the dam-type area is located between the lead bonding area and the display area, and the insulation layer extends to and covers the dam-type area.

Optionally, a portion of the insulation layer which covers the dam-type area and extends to the lead bonding area has a planarized structure.

Optionally, the portion of the insulation layer which extends to the lead bonding area is gently lowered in the extending direction relative to the height of the display panel.

Optionally, the touch display panel further includes an encapsulation layer, wherein:

the encapsulation layer is located between the display panel and the touch layer, and the insulation layer extends to and covers the encapsulation layer.

Optionally, the material of the insulation layer includes an organic material.

Optionally, the lead bonding area includes a touch lead bonding area, and the touch lead is bonded to the touch lead bonding area.

Optionally, the lead bonding area further includes a display drive lead bonding area for bonding the display drive lead;

the touch lead and the display drive lead are connected to the same drive chip.

Optionally, the touch layer further includes: a first conductive layer located at a side of the insulation layer away from the display panel and a second conductive layer located at one side of the insulation layer adjacent to the display panel, wherein:

the first conductive layer includes an inductive electrode, and the second conductive layer includes a drive electrode; or the second conductive layer includes the inductive electrode, and the first conductive layer includes the drive electrode; or the first conductive layer includes the inductive electrode and the drive electrode, and the second conductive layer includes a bridge; or the second conductive layer includes the inductive electrode and the drive electrode, and the first conductive layer includes a bridge.

Optionally, the touch lead includes an inductive lead and a drive lead, the inductive lead and the inductive electrode are located in the same conductive layer, and the drive lead and the drive electrode are located in the same conductive layer;

if the touch lead is not in contact with the side of the insulation layer away from the display panel, the touch lead is led to the side of the insulation layer away from the display panel by punching.

The following technical effects can be achieved by at least one of the above technical solutions adopted by exemplary embodiments of the disclosure:

A touch display panel provided by an exemplary embodiment of the disclosure includes a display panel and a touch layer, wherein the touch layer covers the display panel, the display panel includes a display area and a non-display area including a lead bonding area; the touch layer includes a touch lead and an insulation layer, the insulation layer extends to the lead bonding area, the touch lead extends to the lead bonding area along a side of the insulation layer away from the display panel. Since in the touch display panel provided by the exemplary embodiment of the disclosure, the insulation layer in the touch layer extends to the lead bonding area, and the touch lead may extend to the lead bonding area along the insulation layer, compared with the prior art, the stress acting on the touch lead can be effectively reduced, thereby preventing the touch lead from being broken, and effectively ensuring the touch function of the touch display panel.

An exemplary embodiment of the disclosure also provides a touch display device, including any one of the touch display panels described above.

BRIEF DESCRIPTION OF THE DRAWINGS

In order to more clearly illustrate exemplary embodiments of the disclosure or the technical solutions in the prior art, the drawings to be used in the exemplary embodiments or the description of the prior art will be briefly described below. Obviously, the drawings in the following description are only some exemplary embodiments of the disclosure, and other drawings may be obtained according to the structures shown in the drawings by a person skilled in the art without paying any creative work.

Figure 1:
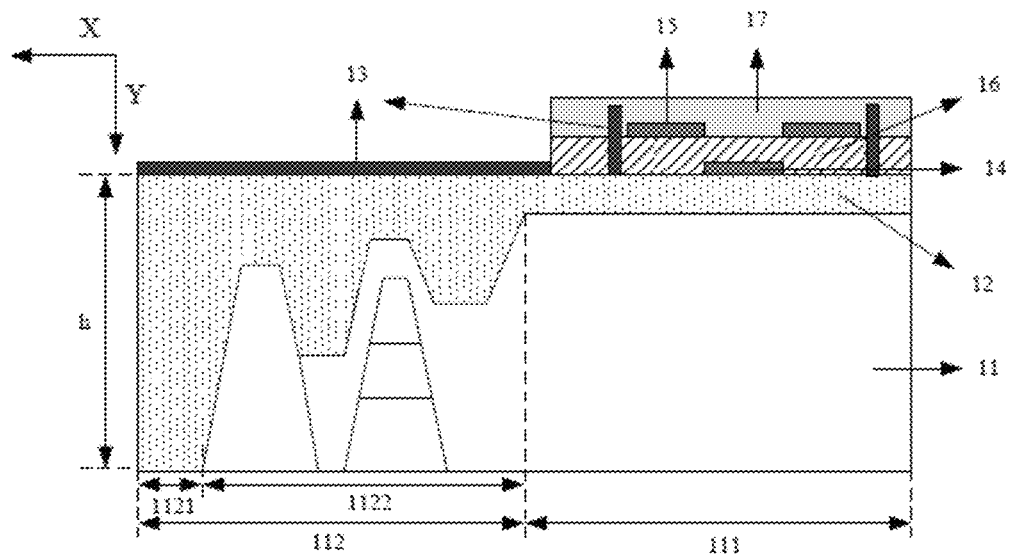
FIG. 1 is a side view of a touch display panel according to an exemplary embodiment of the disclosure.

The implementation of the object, functional features and advantages of the disclosure will be further described with reference to the accompanying drawings.

DETAILED DESCRIPTION

In the existing touch display panel, the touch lead may generally directly cross the non-display area when the touch lead is bonded to the lead bonding area of the display panel. However, the non-display area generally has a concavo-convex structure (for example, a dam-type area), the touch lead needs repeated climbing when it crosses the non-display area, which causes the stress acting on the touch lead to be relatively large, and the touch lead to be easily broken, thereby affecting the touch function of the touch display panel.

In the prior art, in order to avoid breakage of the touch lead caused by repeated climbing of the touch lead, the following two methods can generally be adopted:

The first method: filling organic materials between a plurality of dam-type areas to achieve planarization of the surface morphology of the dam-type area, thereby reducing stress accumulation in the dam-type area, and alleviating the stress acting on the touch lead when the touch lead crosses the dam-type area, thereby achieving the purpose of protecting the touch lead;

The second method: extending the touch lead to a substrate along an end of an seal thin film layer, and then bonding the touch lead to a flexible printed circuit board, wherein the end of the seal thin film layer is inclined. Since the inclined seal thin film layer can buffer the stress, thus the stress acting on the touch lead can be reduced when the touch lead extends to the substrate through the top end of the seal thin film layer, thereby achieving the purpose of protecting the touch lead.

However, in practical applications, although the stress acting on the touch lead can be reduced to a certain extent using the above two methods to further achieve the purpose of protecting the touch lead, the above two methods have certain defects, specifically:

For the first method: in manufacturing the touch display panel, a process complexity is increased because it is required to add a separate process to manufacture an organic layer to achieve the planarization of the surface topography of the dam-type area. In addition, since the degree of planarization, after the organic layer is added, may be insufficient, there is still a case where the touch lead is bent at a large angle, the breakage of the touch lead can not be effectively avoided.

For the second method, when the touch lead passes through the end of the inclined seal thin film layer, the stress of the end of the seal thin film layer acting on the touch lead is relatively large, which easily causes the breakage of the touch lead, that is, after the end of the seal thin film layer is designed into an inclined shape, the breakage of the touch lead can not be effectively avoided.

In order to solve the above problems, the disclosure provides a touch display panel and a touch display device. The touch display panel includes a display panel, an encapsulation layer, and a touch lead, wherein the display panel includes a display area and a non-display area, and the non-display area includes a lead bonding area; the encapsulation layer covers the display area, the encapsulation layer extends to the lead bonding area, and the touch lead extends to the lead bonding area along a side of the encapsulation layer away from the display area.

The touch display panel provided by an exemplary embodiment of the disclosure, through extending the encapsulation layer to the lead bonding area, and extending the touch lead to the lead bonding area along the encapsulation layer, has at least the following advantageous effects in comparison with the two methods mentioned above:

(1) The process is relatively simple, as extending the encapsulation layer would not incur a new process;

(2) Extending the encapsulation layer may avoid the touch lead to bear the stress caused by the end of the encapsulation layer;

(3) A planarization extent of the encapsulation layer is fine, and the touch lead extends to the lead bonding area along the encapsulation layer, so that on one hand, it is possible to eliminate the need for repeated climbing, and on the other hand, the stress acting on the touch lead can be effectively reduced, thereby effectively avoiding breakage of the touch lead and ensuring the touch function of the touch display panel.

In order to solve the above technical problem, an exemplary embodiment of the disclosure further provides a touch display panel and a touch display device. The touch display panel includes a display panel and a touch layer covering the display panel, wherein the display panel includes a display area, and a non-display area including a lead bonding area; the touch layer includes a touch lead and an insulation layer, and the insulation layer extends to the lead bonding area, and the touch lead extends to the lead bonding area along a side of the insulation layer away from the display panel.

The touch display panel provided by the exemplary embodiment of the disclosure, through extending the insulation layer of the touch layer to the lead bonding area, and extending the touch lead to the lead bonding area along the insulation layer has at least the following advantageous effects in comparison with the two methods mentioned above:

(1) The process is relatively simple as extending the insulation layer of the touch layer would not incur a new process;

(2) Extending the insulation layer of the touch layer may cover the end of thin film encapsulation layer of the display panel, and thus avoiding the touch lead to bear the stress caused by the end of the thin film encapsulation layer;

(3) A planarization extent of the insulation layer is fine, and the touch lead extends to the lead bonding area along the insulation layer, so that on one hand, it is possible to eliminate the need for repeated climbing, and on the other hand, the stress acting on the touch lead can be effectively reduced, thereby effectively avoiding breakage of the touch lead and ensuring the touch function of the touch display panel.

The technical solutions of the disclosure are clearly and completely described below in conjunction with the specific exemplary embodiments of the disclosure and the corresponding drawings. It is apparent that the described exemplary embodiments are only some embodiments of the disclosure, are not entire embodiments. Based on the exemplary embodiments of the disclosure, all of other embodiments acquired by those skilled in the art without paying any creative work are included in the protection scope of the disclosure.

It should be noted that the touch display panel provided by the exemplary embodiment of the disclosure may be an on-cell or an out-cell or an in-cell touch display panel. The touch display panel may be applied to various modes of display panel, and is not specifically limited herein.

The technical solutions provided by the exemplary embodiments of the disclosure will be described in detail below with reference to the accompanying drawings.

Exemplary Embodiment 1

FIG. 1 is a side view of a touch display panel according to an exemplary embodiment of the disclosure. The touch display panel is described as follows.

The touch display panel shown in FIG. 1 includes a display panel 11, an encapsulation layer 12, and a touch lead 13, wherein:

The display panel 11 can include a display area 111 and a non-display area 112. The non-display area 112 can include a lead bonding area 1121. The encapsulation layer 12 covers the display area 111, and may be used to encapsulate the display area 111.

It should be noted that the encapsulation layer 13 may be a thin film encapsulation layer for encapsulating the display panel 11, or may be a thin film encapsulation layer and a substrate layer between the touch layer and the thin film encapsulation layer, or includes both the thin film encapsulation layer and the substrate layer, which is not specifically limited herein. The encapsulation layer, the touch layer and the substrate layer may be collectively referred to as a base layer. The exemplary embodiment of the disclosure can be described by taking the encapsulation layer 13 as the thin film encapsulation layer as an example.

In the exemplary embodiment of the disclosure, the encapsulation layer 12 can extend along an X direction shown in FIG. 1 and extend to the lead bonding area 1121 along the X direction. The touch lead 13 can extend to the lead bonding area 1121 along a side of the encapsulation layer 12 away from the display panel 11. Since the touch lead 13 can extend to the lead bonding area 1121 along the encapsulation layer 12, compared with the prior art, the stress acting on the touch lead 13 can be reduced and the touch lead 13 can be prevented from being broken, thereby ensuring the touch function of the touch display panel.

The non-display area 112 shown in FIG. 1 may further include a dam-type area 1122 which is located between the lead bonding area 1121 and the display area 111. When the encapsulation layer 12 extends to the lead bonding area 1121, the dam-type area 1122 may also be covered. In this way, the repeated climbing in the dam-type area 1122 can be effectively avoided when the touch lead 13 extends to the lead bonding area 1121, thereby reducing the stress acting on the touch lead 13 and preventing the touch lead 13 from being broken.

In an exemplary embodiment of the disclosure, the portion of the encapsulation layer 12 which extends to the lead bonding area 1121 may have a planarized structure. As shown in FIG. 1, the encapsulation layer 12 may extend horizontally to the lead bonding area 1121 along the X direction.

Specifically, the height of the portion of the encapsulation layer 12 which extends to the lead bonding area 1121 relative to the display panel 11 remains unchanged along the extending direction of the encapsulation layer 12. As shown in FIG. 1, the height of the encapsulation layer 12 in the Y direction may be regarded as the height of the encapsulation layer 12 relative to the display panel 11, and the height of the encapsulation layer 12 in the Y direction remains unchanged at h along the X direction (i.e., the extending direction of the encapsulation layer 12).

Thus, the touch lead 13 may extend horizontally to the lead bonding area 1121 along the encapsulation layer 12, and the portion of the touch lead 13 which extends to the lead bonding area 1121 also remains unchanged at h relative to the height of the display panel 11.

After the touch lead 13 extends to the lead bonding area 1121, the bonding with the lead bonding area 1121 can be achieved at the height h. Specifically, the lead bonding area 1121 may include a touch lead bonding area (not shown in FIG. 1), and the touch lead bonding area may include a touch drive chip, and the touch lead 13 may be connected to the touch drive chip included in the touch lead bonding area at the height h, thereby realizing the bonding of the touch lead 13.

In the touch display panel provided by the exemplary embodiment of the disclosure, since the touch lead 13 may extend horizontally to the lead bonding area 1121 along the encapsulation layer 12, and be bonded to the touch lead bonding area in the lead bonding area 1121 at a height h. Thus compared with the prior art, the repeated climbing of the touch lead 13 can be avoided, thereby preventing the touch lead 13 from being broken.

In the exemplary embodiment of the disclosure, the display panel shown in FIG. 1 may further include a display drive lead (not shown in FIG. 1), and the display drive lead may be a power lead, a signal scanning line, and a data voltage signal line in the display panel and the like, which are not specifically limited herein.

The display drive lead may also be bonded to the lead bonding area 1121 in the exemplary embodiment of the disclosure. Specifically, the lead bonding area 1121 may further include a display drive lead bonding area (not shown in FIG. 1), and the display drive lead bonding area may include a display drive chip. When the display drive lead is bonded, the display drive lead may be connected to the display drive chip included in the display drive lead bonding area.

It should be noted that, since the display drive lead does not need to climb repeatedly when bonded to the lead bonding area, in order to facilitate bonding of the display drive lead in the lead bonding area 1121, after the encapsulation layer 12 extends to cover the dam-type area 1122 and extends to the lead bonding area 1211, the touch lead bonding area may be covered and the display drive lead bonding area may be exposed, thereby facilitating bonding the display drive lead in the display drive lead area.

Figure 2:
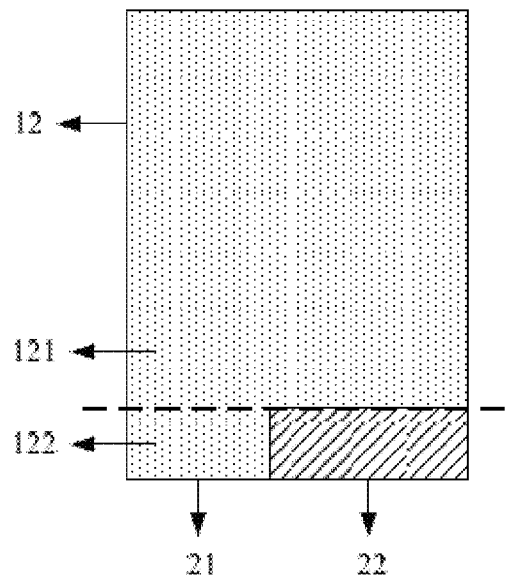
FIG. 2 is a top view of an encapsulation layer according to an exemplary embodiment of the disclosure.

As shown in FIG. 2, FIG. 2 is a top view of an encapsulation layer according to an exemplary embodiment of the disclosure.

In FIG. 2, the encapsulation layer 12 may include two areas 121 and 122. The encapsulation layer of the portion 121 may be used to encapsulate the display area in the display panel, and the encapsulation layer of the portion 122 may be an encapsulation layer which extends to cover the dam-type area 1122 as shown in FIG.1 and extends to the lead bonding area 1121.

21 as shown in FIG. 2 may be a touch lead bonding area in the lead bonding area, and 22 may be a display drive lead bonding area in the lead bonding area. As can be seen from FIG. 2, the touch lead bonding area 21 may be covered by the extending portion 122 of the encapsulation layer 12, and the display drive lead bonding area 22 may not be covered by the encapsulation layer 12.

It should be noted that, since the touch lead 13 extends to the lead bonding area 1121 along the side of the encapsulation layer 12 away from the display panel 11, which has a certain height relative to the display panel, and the display drive lead extends to the lead bonding area 1121 without passing through the encapsulation layer 12, that is, the height of the display drive lead relative to the display panel may be zero, therefore, a bonding height of the touch lead 13 is different from that of the display drive lead when the touch lead 13 and the display drive lead are bonded together in the lead bonding area 1121. Here, the bonding height of the touch lead 13 is greater than that of the display drive lead.

Figure 3:
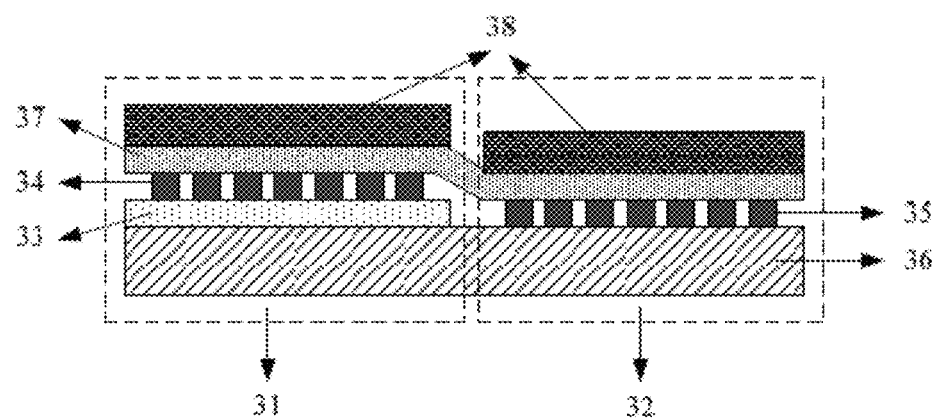
FIG. 3 is a front view of a lead bonding area according to an exemplary embodiment of the disclosure.

As shown in FIG. 3, FIG. 3 is a front view of a lead bonding area according to an exemplary embodiment of the disclosure.

In FIG. 3, 31 is a touch lead bonding area of the lead bonding area, 32 is a display drive lead bonding area of the lead bonding area, 33 is a portion of the encapsulation layer which extendings to cover the dam-type area and extends to the lead bonding area (specifically, a portion of the encapsulation layer extending to the touch lead bonding area 31), 34 is a touch lead, 35 is a display drive lead, and 36 is a display panel which may specifically include a thin film transistor (TFT) and an organic light-emitting diode (OLED).

As can be seen from FIG. 3, the touch lead 34 is bonded to the touch lead bonding area 31, the display drive lead 35 is bonded to the display drive lead bonding area 32, and the bonding height of the touch lead 34 is higher than that of the display drive lead 35.

In FIG. 3, when the touch lead 34 and the display drive lead 35 are bonded, the touch lead 34 and the display drive lead 35 may be covered with a conductive adhesive film 37 (specifically, the conductive adhesive film may be an ACF film layer). The conductive adhesive film 37 can buffer the touch lead 34 and the display drive lead 35, and the conductive adhesive film 37 can be covered with the flexible printed circuit board 38 to achieve the bonding of the touch lead 34 and the display drive lead 35 at different heights.

In this way, on the one hand, by bonding together the touch lead 34 and the display drive lead 35 in the lead bonding area, integration of the touch lead 34 and the display drive lead 35 can be realized, and on the other hand, the touch lead 34 and the display drive lead 35 are bonded at different heights, and the repeated climbing of the touch lead 34 can be avoided, thereby avoiding short lines.

It should be noted that, in order to facilitate bonding of the touch lead 34 and the display drive lead 35 at different heights, in the exemplary embodiment of the disclosure, the portion of the flexible printed circuit board 38 on the lead bonding area may be divided into blocks according to a touch lead bonding area 31 and a display drive lead bonding area 32. Specifically, as shown in FIG. 3, the flexible printed circuit board 38 can be divided into two blocks, one block for bonding the touch lead 34 in the touch lead bonding area 31, and the other block for bonding the display drive lead 35 in the display drive lead bonding area 32.

In the practical application, since the thickness of the encapsulation layer (about 10 μm) is much smaller than the thickness of the flexible printed circuit board, the flexible printed circuit board may not be subjected to the above-mentioned block dividing processing. No specific limitation will be made in the exemplary embodiment of the disclosure.

In addition, in order to facilitate bonding of the touch lead 34 and the display drive lead 35 to the lead bonding area at different heights, the touch lead 34 and the display drive lead 35 may also extend to the lead bonding area in the same direction. As shown in FIG. 3, the touch lead 34 and the display drive lead 35 may extend to the lead bonding area in a outward direction perpendicular to the plane shown in FIG.3.

In the exemplary embodiment of the disclosure, the touch lead extends to the lead bonding area along a side of the encapsulation layer away from the display panel, in order to further ensure that the touch lead will not be broken when extending along the encapsulation layer, the material of the encapsulation layer may include an organic material with less stress, for example, the material of the encapsulation layer may be an organic material or a combination of an organic material and an inorganic material. Wherein the organic material may be tetrafluoroethylene, polytetrafluoroethylene or the like.

In the touch display panel of FIG. 1, the touch display panel may further include a first conductive layer and a second conductive layer, wherein the first conductive layer may be located at one side of the encapsulation layer away from the display panel, the second conductive layer may be located between the encapsulation layer and the first conductive layer.

In other implementations, the first conductive layer may also be located at a side of the encapsulation layer adjacent to the display panel, and the second conductive layer may be located between the encapsulation layer and the first conductive layer. The exemplary embodiment of the disclosure can be described by taking the following case as an example: the first conductive layer may be located at a side of the encapsulation layer away from the display panel, and the second conductive layer may be located between the encapsulation layer and the first conductive layer.

As shown in FIG. 1, the first conductive layer may include an inductive electrode 15, and the second conductive layer may include a drive electrode 14, and the first conductive layer may be located at a side of the encapsulation layer 12 away from the display panel 11, and the second conductive layer may be located between the encapsulation layer 12 and the first conductive layer.

The inductive electrode 15 and the drive electrode 14 may be transparent conductive materials, including but not limited to: ITO (Indium Tin Oxide), AgNW (Silver Nanowire), graphene, etc.; and they may be metal materials.

The touch display panel shown in FIG. 1 may further include an insulation layer 16 and a protective layer 17, wherein the insulation layer 16 may cover the second conductive layer and is used to insulate the drive electrode 14 from the inductive electrode 15. The protective layer 17 may cover the first conductive layer and is used to encapsulate and protect the inductive electrode 15.

In other exemplary embodiments, the first conductive layer may include a drive electrode, the second conductive layer may include the inductive electrode. Alternatively, the first conductive layer may include the inductive electrode and the drive electrode, the second conductive layer may include a bridge for connecting the inductive electrode or the drive electrode. Alternatively, the second conductive layer may include the inductive electrode and the drive electrode, the first conductive layer may include a bridge for connecting the inductive electrode or the drive electrode, which is not specifically limited herein.

In the exemplary embodiment of the disclosure, the touch lead may include an inductive lead and a drive lead, wherein the inductive lead may be located in the same conductive layer as the inductive electrode, and the drive lead may be located in the same conductive layer as the drive electrode. For example, if the inductive electrode is located in the first conductive layer and the drive electrode is located in the second conductive layer, the inductive lead is located in the first conductive layer, the drive lead is located in the second conductive layer.

It should be noted that, in the exemplary embodiment of the disclosure, the touch lead needs to extend to the lead bonding area along the encapsulation layer. Therefore, in order to facilitate the touch lead extending along the encapsulation layer, if the touch lead is not in contact with a side of the encapsulation layer away from the display panel, the touch lead may be led to a side of the encapsulation layer away from the display panel by punching.

As shown in FIG.1, the inductive lead may be located in the first conductive layer, the drive lead may be located in the second conductive layer, and the second conductive layer directly covers the encapsulation layer 12. The drive lead may be regarded as being in contact with one side of the encapsulation layer 12 away from the display panel 11, and the inductive lead may be regarded as being not in contact with one side of the encapsulation layer 12 away from the display panel 11. In order to facilitate the inductive lead to extend to the lead bonding area 1121 along one side of the encapsulation layer 12 away from the display panel 11, the insulation layer 16 may be punctured, so that the inductive lead may be led to one side of the encapsulation layer 12 away from the display panel 11 by puncturing, and may extend to the lead bonding area 1121 along one side of the encapsulation layer 12 away from the display panel 11.

It should be noted that, in other exemplary embodiments, the touch lead may also be led to the side of the encapsulation layer away from the display panel by other means. For example, when the touch lead is manufactured, the touch lead may be exposed (i.e., the touch lead is not covered by another film layer), so that the touch lead may be led to one side of the encapsulation layer away from the display panel directly in the exposed area of the touch lead.

The touch display panel provided by the exemplary embodiment of the disclosure includes: a display panel, an encapsulation layer and a touch lead. The display panel includes a display area, and a non-display area which includes a lead bonding area. And the encapsulation layer covers the display area and extends to the lead bonding area. The touch lead extends to the lead bonding area along a side of the encapsulation layer away from the display area. Since in the touch display panel provided by the exemplary embodiment of the disclosure, the encapsulation layer extends to the lead bonding area, and the touch lead may extend to the lead bonding area along the encapsulation layer, compared with the prior art, the stress acting on the touch lead can be effectively reduced, thereby preventing the touch lead from being broken, and effectively ensuring the touch function of the touch display panel.

In the touch display panel provided by the exemplary embodiment of the disclosure, the encapsulation layer may extend to the lead bonding area, and the touch lead extends to the lead bonding area along a side of the encapsulation layer away from the display panel, thereby reducing the stress acting on the touch lead to prevent the touch lead from being broken. In other exemplary embodiments, the insulation layer in the touch layer may extend to the lead bonding area, the touch lead extends to the lead bonding area along a side of the insulation layer away from the display panel, thereby reducing the stress acting on the touch lead to prevent the touch lead from being broken.

Figure 4:
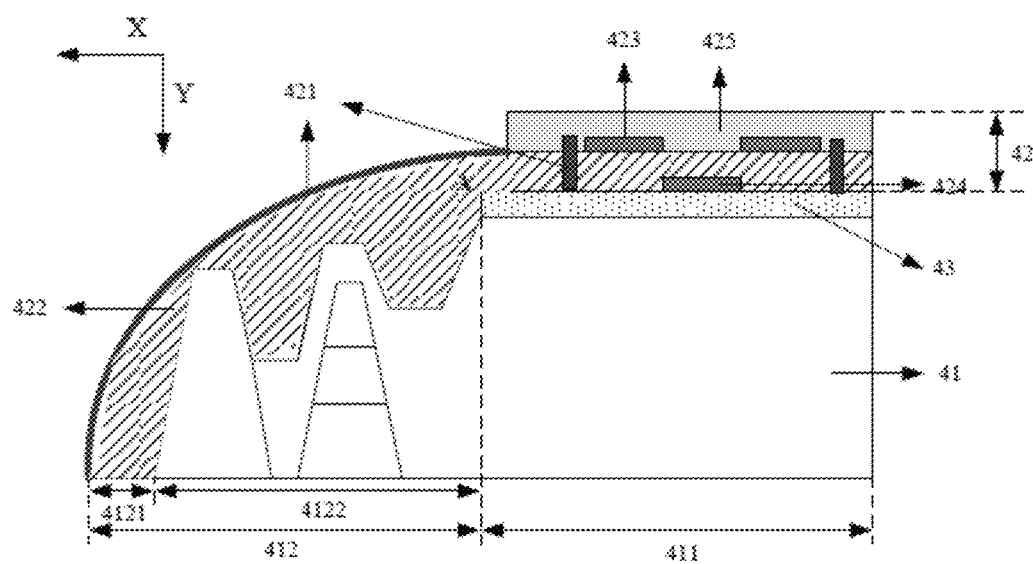
FIG. 4 is a side view of another touch display panel according to an exemplary embodiment of the disclosure.

FIG. 4 is a side view of another touch display panel according to an exemplary embodiment of the disclosure. The touch display panel is described as follows.

The touch display panel shown in FIG. 4 includes a display panel 41 and a touch layer 42 covering the display panel 41, wherein:

The display panel 41 includes a display area 411 and a non-display area 412. The non-display area 412 includes a lead bonding area 4121. The touch layer 42 includes a touch lead 421 and an insulation layer 422.

In the exemplary embodiment of the disclosure, the insulation layer 422 can extend in the X direction shown in FIG. 4 and extend all the way to the lead bonding area 4121 along the X direction. The touch lead 421 may extend to the lead bonding area 4121 along one side of the insulation layer 422 away from the display panel 41.

Since the touch lead 421 may extend to the lead bonding area 4121 along the insulation layer 422, the stress acting on the touch lead 421, compared with the prior art can be effectively reduced, thereby preventing the touch lead 421 from being broken and ensuring the touch function of the touch display panel.

The non-display area 412 shown in FIG. 4 may further include a dam-type area 4122 which is located between the lead bonding area 4121 and the display area 411. When the insulation layer 422 extends to the lead bonding area 4121, the dam-type area 4122 may also be covered. In this way, when the touch lead 421 is led to the lead bonding area 4121, the repeated climbing of the touch lead 421 in the dam-type area 4122 can be effectively avoided, thereby reducing the stress acting on the touch lead 421 and preventing the touch lead 421 from being broken.

In the exemplary embodiment of the disclosure, the portion of the insulation layer 422 extending to the lead bonding area 4121 may have a curved structure with planarization. As shown in FIG. 4, the insulation layer 422 is bent and extends to the lead bonding area 4121 in the X direction, and the insulation layer 422 has a curved structure with planarization.

Specifically, a portion of the insulation layer 422 extending to the lead bonding area 4121 is gently lowered relative to a height of the display panel 41 along the extending direction of the insulation layer 422. As shown in FIG. 4, the height of the insulation layer 422 in the Y direction can be regarded as the height of the insulation layer 422 relative to the display panel 11, and the height of the insulation layer 422 in the Y direction is gently lowered in the X direction.

In this way, the touch lead 421 may extend to the lead bonding area 4121 along the insulation layer 422 of a curved structure with planarization, and the portion of the touch lead 421 extending to the lead bonding area 4121 is also gently lowered relative to the height of the display panel 41 until the touch lead 421 extends to and is bonded with the lead bonding area 4121.

The lead bonding area 4121 may include a touch lead bonding area (not shown in FIG. 4). When bonded to the lead bonding area 4121, the touch lead 421 may be bonded to the touch lead bonding area. The touch lead bonding area may include a touch drive chip. After the touch lead 421 is bonded, the touch lead may be connected to the touch drive chip.

Figure 5:
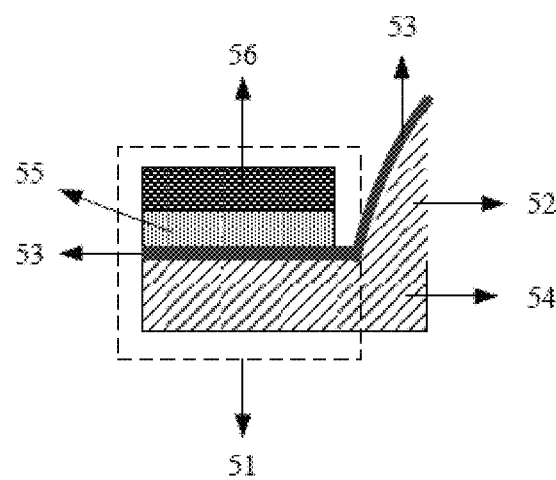
FIG. 5 is a side view of a lead bonding area according to an exemplary embodiment of the disclosure.

As shown in FIG. 5, FIG. 5 is a side view of a lead bonding area according to an exemplary embodiment of the disclosure.

In FIG. 5, 51 is a touch lead bonding area of the lead bonding area, 52 is a portion of the insulation layer 422 which extendings to covers the dam-type area and extends to the lead bonding area (specifically, the portion may be a portion of the insulation layer 422 extending to the touch lead bonding area 4121), 53 is a touch lead, 54 is a display panel, and the display panel 54 may specifically include a thin film transistor (TFT) and an organic light emitting diode (OLED). As can be seen from FIG. 5, the touch lead 53 may be bonded to the touch lead bonding area 51 after extending to the lead bonding area along the insulation layer 52.

In FIG. 5, when the touch lead 53 is bonded, the touch lead 53 may be covered with a conductive adhesive film 55 (specifically, an ACF film layer), which may buffer the touch lead 53. the conductive adhesive film 55 may also be covered with the flexible printed circuit board 56 to achieve bonding of the touch lead 53.

In the exemplary embodiment of the disclosure, the lead bonding area may further include a display drive lead bonding area used for bonding the display drive lead. In this way, bonding together of the touch lead and the display drive lead in the lead bonding area can be achieved. The touch lead and the display drive lead may be bonded to different drive chips or the same drive chip.

In the touch display panel provided by the exemplary embodiment of the disclosure, the touch lead 421 may extend to the lead bonding area 4121 along the insulation layer 422 of a curved structure with planarization and be bonded to the touch lead bonding area in the lead bonding area 4121. Therefore, compared with the prior art, the touch lead 421 can be prevented from repeatedly climbing, thereby preventing the touch lead 421 from being broken.

The touch display panel shown in FIG. 4 may further include an encapsulation layer 43 which may cover the display area 411 of the display panel 41. In the exemplary embodiment of the disclosure, the encapsulation layer 43 may be a thin film encapsulation layer for encapsulating the display panel 41, or a substrate layer between the thin film encapsulation layer and the touch layer, or includes both the thin film encapsulation layer and the substrate layer, and are not specifically limited herein.

In FIG. 4, the encapsulation layer 43 has an end portion A at the boundary between the display area 411 and the non-display area 412. When the insulation layer 422 extends to cover the dam-type area 4122, the insulation layer 422 may cover the end portion A of the encapsulation layer 43. Thus the problem of breakage of the touch lead 422 in the prior art caused by the touch lead 422 crossing the end A of the encapsulation layer 43 can be efficiently avoided.

In the exemplary embodiment of the disclosure, the touch lead extends to the lead bonding area along a side of the insulation layer away from the display panel, in order to further ensure that the touch lead will not be broken when extending along the insulation layer, the material of the encapsulation layer may use an organic material with less stress. The organic material may be tetrafluoroethylene, polytetrafluoroethylene or the like which is not specifically limited in the exemplary embodiment of the disclosure.

In the touch display panel of FIG. 4, the touch layer may further include a first conductive layer and a second conductive layer, wherein the first conductive layer may be located at one side of the insulation layer away from the display panel, the second conductive layer may be located at one side of the insulation layer adjacent to the display panel 411, i.e., the insulation layer may be located between the first conductive layer and the second conductive layer.

As shown in FIG. 4, the first conductive layer may include an inductive electrode 423, and the second conductive layer may include a drive electrode 424, and the first conductive layer may be located at a side of the insulation layer 422 away from the display panel 41, and the second conductive layer may be located at one side of the insulation layer 422 adjacent to the display panel 41.

The inductive electrode 423 and the drive electrode 424 may be transparent conductive materials, including but not limited to: ITO (Indium Tin Oxide), AgNW (Silver Nanowire), graphene, etc.; they may also be metal materials.

The touch layer shown in FIG. 4 may further include a protective layer 425. Wherein, the protective layer 425 may cover the first conductive layer and used to encapsulate and protect the inductive electrode 423.

In other exemplary embodiments, the first conductive layer may include a drive electrode, the second conductive layer may include the inductive electrode. Alternatively, the first conductive layer may include the inductive electrode and the drive electrode, and the second conductive layer may include a bridge for connecting the inductive electrode or the drive electrode. Alternatively, the second conductive layer may include the inductive electrode and the drive electrode, the first conductive layer may include a bridge for connecting the inductive electrode or the drive electrode, which is not specifically limited herein.

In the exemplary embodiment of the disclosure, the touch lead may include an inductive lead and a drive lead, wherein the inductive lead may be located in the same conductive layer as the inductive electrode, and the drive lead may be located in the same conductive layer as the drive electrode. For example, if the inductive electrode is located in the first conductive layer and the drive electrode is located in the second conductive layer, the inductive lead is located in the first conductive layer, the drive lead is located in the second conductive layer.

It should be noted that, in the exemplary embodiment of the disclosure, the touch lead needs to extend to the lead bonding area along the insulation layer. Therefore, in order to facilitate the touch lead extending along the encapsulation layer, the touch lead may be led to a side of the insulation layer away from the display panel by punching if the touch lead is not in contact with a side of the insulation layer away from the display panel.

As shown in FIG. 4, the inductive lead may be located in the first conductive layer, the drive lead may be located in the second conductive layer. The first conductive layer directly covers the insulation layer 422 and the insulation layer 422 directly covers the second conductive layer. Wherein, the inductive lead may be regarded as being in contact with one side of the insulation layer 422 away from the display panel 41, and the drive lead may be regarded as being not in contact with one side of the insulation layer 422 away from the display panel 41. Accordingly, In order to facilitate the drive lead extending to the lead bonding area 4121 along one side of the insulation layer 422 away from the display panel 41, the insulation layer 422 may be punctured, so that the drive lead may be led to one side of the insulation layer 422 away from the display panel 41 by puncturing, and extend to the lead bonding area along one side of the insulation layer 422 away from the display panel 41.

It should be noted that, in other exemplary embodiments, the touch lead may also be led to the side of the insulation layer away from the display panel by other means. For example, when the touch lead is manufactured, the touch lead may be exposed (i.e., the touch lead is not covered by the insulation layer and other film layer), so that the touch lead may be led to one side of the insulation layer away from the display panel directly in the exposed area of the touch lead.

In the touch display panel provided by the exemplary embodiment of the disclosure, the insulation layer in the touch layer extends to the lead bonding area, the touch lead extends to the lead bonding area along a side of the insulation layer away from the display panel. Since in the touch display panel provided by the exemplary embodiment of the disclosure, the insulation layer in the touch layer extends to the lead bonding area, and the touch lead may extend to the lead bonding area along the insulation layer, compared with the prior art, the stress acting on the touch lead can be effectively reduced, thereby preventing the touch lead from being broken, and effectively ensuring the touch function of the touch display panel.

Exemplary Embodiment 2

The exemplary embodiment of the disclosure also provides a touch display device. The touch display device may include any one of the touch display panels described in the first exemplary embodiment.

It will be apparent to a person skilled in the art that although preferred exemplary embodiment of the disclosure have been described, the other modifications and changes may be made to these exemplary embodiments as long as a person skilled in the art knows basic innovative concepts. Therefore, the appended claims are intended to be interpreted as including the preferred exemplary embodiments and the modifications and changes which fall into the protection scope of the disclosure.

It will be apparent to a person skilled in the art that various modifications and changes may be made to the disclosure without departing from the scope of the disclosure. Thus, the disclosure is intended to cover the modifications and changes of the disclosure if the modifications and changes made to the disclosure fall into the protection scope of the claims and the equivalent technology of the disclosure.

What is claimed is:

1. A touch display panel comprising: a display panel, an encapsulation layer, and a touch lead,
    the display panel comprising a display area and a non-display area, and the non-display area comprising a lead bonding area;
    the encapsulation layer covering the display area, the encapsulation layer extending to the lead bonding area, and the touch lead extending to the lead bonding area along a side of the encapsulation layer away from the display area,
    wherein the touch display panel further comprises a first conductive layer and a second conductive layer, the first conductive layer being located on one side of the encapsulation layer, and the second conductive layer being located between the encapsulation layer and the first conductive layer, wherein:
    the first conductive layer comprises an inductive electrode, and the second conductive layer comprises a drive electrode; or
    the second conductive layer comprises the inductive electrode, and the first conductive layer comprises the drive electrode; or
    the first conductive layer comprises the inductive electrode and the drive electrode, and the second conductive layer comprises a bridge; or
    the second conductive layer comprises the inductive electrode and the drive electrode, and the first conductive layer comprises a bridge.

2. The touch display panel according to claim 1, the non-display area comprising a dam-type area, wherein,
    the dam-type area is located between the lead bonding area and the display area, and the encapsulation layer extends to and covers the dam-type area.

3. The touch display panel according to claim 1, wherein, a portion encapsulation layer which covers the dam-type area and extends to the lead bonding area has a planarized structure.

4. The touch display panel according to claim 3, wherein, a height of the portion of the encapsulation layer which extends to the lead bonding area relative to the display panel remains unchanged along an extending direction of the encapsulation layer.

5. The touch display panel according to claim 1, wherein, the lead bonding area includes a touch lead bonding area and a display drive lead bonding area, the encapsulation layer after extending to the lead bonding area, covers the touch lead bonding area and does not cover the display drive lead bonding area.

6. The touch display panel according to claim 5, the display panel further comprising: a display drive lead, wherein,
    the display drive lead and the touch lead extend to the lead bonding area in a same direction, and the display drive lead is bonded to the display drive lead bonding area at a first height, the touch lead is bonded to the touch lead bonding area at a second height, the first height is less than the second height.

7. The touch display panel according to claim 6, wherein,
    the touch lead and the display drive lead are covered with a conductive adhesive film, the conductive adhesive film is covered with a flexible printed circuit board to achieve bonding of the touch lead and the display drive lead at different heights, and the encapsulation layer comprises at least one of a thin film encapsulation layer and a substrate layer, a material of the encapsulation layer comprises an organic material.

8. The touch display panel according to claim 1, wherein,
    the touch lead comprises an inductive lead and a drive lead, the inductive lead and the inductive electrode are located in a same conductive layer, and the drive lead and the drive electrode are located in a same conductive layer;
    if the touch lead is not in contact with the side of the encapsulation layer away from the display panel, the touch lead is led to the side of the encapsulation layer away from the display panel by punching.

9. A touch display panel, comprising: a display panel and a touch layer covering the display panel,
    the display panel comprising a non-display area comprising a lead bonding area; the touch layer comprising a touch lead and an insulation layer, and the insulation layer extending to the lead bonding area, and the touch lead extending to the lead bonding area along a side of the insulation layer away from the display panel,
    wherein the touch layer further comprises a first conductive layer located at a side of the insulation layer away from the display panel and a second conductive layer located at a side of the insulation layer adjacent to the display panel, wherein:
    the first conductive layer comprises an inductive electrode, and the second conductive layer comprises a drive electrode; or
    the second conductive layer comprises the inductive electrode, and the first conductive layer comprises the drive electrode; or
    the first conductive layer comprises the inductive electrode and the drive electrode, and the second conductive layer comprises a bridge; or
    the second conductive layer comprises the inductive electrode and the drive electrode, and the first conductive layer comprises a bridge.

10. The touch display panel according to claim 9, the display panel further comprising a display area, the non-display area further comprising a dam-type area, wherein:
    the dam-type area is located between the lead bonding area and the display area, and the insulating layer extends and covers the dam-type area.

11. The touch display panel according to claim 9 wherein,
    a portion of the insulating layer which covers the dam-type area and extends to the lead bonding area has a planarized structure.

12. The touch display panel according to claim 11, wherein,
the portion of the insulating layer which extends to the lead bonding area is gently lowered along an extending direction relative to a height of the display panel.

13. The touch display panel according to claim 12, further comprising: an encapsulation layer, wherein:
the encapsulation layer is located between the display panel and the touch layer, and the insulation layer extends to and covers the encapsulation layer.

14. The touch display panel according to claim 9, wherein,
a material of the insulating layer comprises an organic material.

15. The touch display panel according to claim 9, wherein,
the lead bonding area comprises a touch lead bonding area, and the touch lead is bonded to the touch lead bonding area.

16. The touch display panel according to claim 15, wherein,
the lead bonding area further comprises a display drive lead bonding area for bonding the display drive lead;
the touch lead and the display drive lead are connected to a same drive chip.

17. The touch display panel as claimed in claim 9, wherein,
the touch lead comprises an inductive lead and a drive lead, the inductive lead and the inductive electrode are located in a same conductive layer, and the drive lead and the drive electrode are located in a same conductive layer;
if the touch lead is not in contact with the side of the insulation layer away from the display panel, the touch lead is led to the side of the insulation layer away from the display panel by punching.

18. A touch display device, comprising the touch display panel according to claim 1.

* * * * *